(12) United States Patent
Park et al.

(10) Patent No.: US 7,683,418 B2
(45) Date of Patent: Mar. 23, 2010

(54) HIGH-TEMPERATURE STABLE GATE STRUCTURE WITH METALLIC ELECTRODE

(75) Inventors: Dae-Gyu Park, Wappingers Falls, NY (US); Oleg G. Gluschenkov, Poughkeepsie, NY (US); Michael A. Gribelyuk, Stamford, CT (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/277,539

(22) Filed: Nov. 25, 2008

(65) Prior Publication Data

US 2009/0101993 A1    Apr. 23, 2009

Related U.S. Application Data

(62) Division of application No. 11/782,351, filed on Jul. 24, 2007, now Pat. No. 7,521,345, which is a division of application No. 10/869,658, filed on Jun. 16, 2004, now Pat. No. 7,279,413.

(51) Int. Cl.
H01L 27/108 (2006.01)

(52) U.S. Cl. .................. 257/310; 257/411; 257/368

(58) Field of Classification Search .................. 257/368, 257/310, 411
See application file for complete search history.

(56) References Cited

U.S. PATENT DOCUMENTS

| 6,407,435 | B1 * | 6/2002 | Ma et al. ............... 257/411 |
| 6,465,334 | B1 | 10/2002 | Buynoski et al. |
| 6,784,508 | B2 | 8/2004 | Tsunashima et al. |
| 2004/0016973 | A1 | 1/2004 | Rotondaro et al. |

* cited by examiner

*Primary Examiner*—Douglas M Menz
(74) *Attorney, Agent, or Firm*—Scully, Scott, Murphy & Presser, P.C.; Joseph P. Abate, Esq.

(57) ABSTRACT

The present invention provides a method for depositing a dielectric stack comprising forming a dielectric layer atop a substrate, the dielectric layer comprising at least oxygen and silicon atoms; forming a layer of metal atoms atop the dielectric layer within a non-oxidizing atmosphere, wherein the layer of metal atoms has a thickness of less than about 15 Å; forming an oxygen diffusion barrier atop the layer of metal atoms, wherein the non-oxidizing atmosphere is maintained; forming a gate conductor atop the oxygen diffusion barrier; and annealing the layer of metal atoms and the dielectric layer, wherein the layer of metal atoms reacts with the dielectric layer to provide a continuous metal oxide layer having a dielectric constant ranging from about 25 to about 30 and a thickness less than about 15 Å.

5 Claims, 8 Drawing Sheets

HIGH-TEMPERATURE STABLE GATE STRUCTURE WITH METALLIC ELECTRODE

RELATED APPLICATIONS

The present application is a divisional application of parent application Ser. No. 11/782,351, filed on Jul. 24, 2007, which is a divisional application of parent application Ser. No. 10/869,658, filed on Jun. 16, 2004, which is related to co-assigned U.S. Pat. No. 7,023,064 entitled TEMPERATURE STABLE METAL NITRIDE GATE ELECTRODE, filed on the same date. The entire content of this related application is incorporated by reference.

FIELD OF THE INVENTION

The present invention relates to a method for forming gate dielectrics, and more particularly, to a method for depositing a continuous high-k dielectric having a thickness on the order of about 15 Å or less. The term "high-k" denotes a dielectric material that has a dielectric constant of about 20 or greater. The term "continuous" denotes a continuously present layer of dielectric material, free of island growth.

BACKGROUND OF THE INVENTION

With decreasing gate lengths in metal oxide semiconductor field effect transistors (MOSFET), thin dielectrics are necessary to increase drive current and improve short channel behavior.

Conventional methods for forming high-k dielectrics include chemical vapor deposition (CVD), atomic layer deposition (ALD), or physical vapor deposition (PVD). For ultra-thin high-k gate dielectric formation, physical vapor deposition methods have fallen into disfavor, as they typically damage the deposition surface during sputtering. Alternatively, chemical vapor deposition (CVD) and atomic layer deposition (ALD) are substantially damage free processes, in which good step coverage is provided with less particle generation than physical vapor deposition (PVD).

Prior forming methods have been unsuccessful in providing continuous and uniform ultra-thin high-k gate dielectric layers. The term "ultra-thin" denotes a high-k gate dielectric layer having a thickness on the order of about 15 Å or less. Atomic layer deposition (ALD) and chemical vapor deposition (CVD) fail to provide uniform gate dielectric layers, since atomic layer deposition and chemical vapor deposition typically result in non-uniform nucleation when utilized to deposit ultra-thin dielectric layers. Non-uniform nucleation results from the complex bonding of metal organic or metal halide precursors, which are utilized in CVD and ALD processes. The complex bonding of metal organic or metal halide precursors acts as an obstruction to full saturation of the deposition surface. For example, hafnium chloride precursors comprise hafnium bonded with four chlorides, and when the hafnium of the precursor bonds to a silicon-containing surface of a substrate the bonded chlorides can block up to 10 bonding sites of the substrate, resulting in non-uniform nucleation. In ultra-thin film deposition, non-uniform nucleation produces a non-continuous layer resulting in islands of deposited dielectric material. Non-continuous dielectric layers incorporated within gate dielectrics typically result in leakage effects, which reduce device performance.

Gate dielectric and gate electrode material and structure should posses a number of properties to be useful for state-of-the-art MOSFET devices. First, the gate dielectric should be "electrically thin" when the gate is biased in inversion creating a large surface density of mobile inversion charge in the transistor channel. The term "electrically thin" denotes a high capacitance per unit area. In turn, the gate dielectric capacitance in inversion consists of several parts including the capacitance of the dielectric material itself and the so-called depletion capacitance of the adjacent gate electrode. In order to make the gate dielectric electrically thinner, one would (1) physically thin down gate dielectrics, (2) select gate dielectric materials with higher dielectric permittivity ("high k" materials), and (3) choose gate electrodes adjacent to the gate dielectric with a smaller depletion region.

Second, the entire gate structure including FET channel region, gate dielectric, and gate electrode should be able to support a FET with a low threshold voltage from about 0.1V to about 0.4V. While a desired threshold voltage can be achieved by varying channel doping and selecting the optimum work-function for the gate electrode, the threshold voltage can be inadvertently altered by the presence of a large fixed and/or trapped charge at both the gate dielectric interface and within the dielectric itself. Further, the density of trapped and/or fixed charge can be inadvertently altered by exposure to a high-temperature (e.g., a 1000° C. junction activation anneal) or during FET operation. Accordingly, it is highly desirable to minimize the total surface density of such fixed and/or trapped charge to prevent any undesirable shifts in threshold voltage. Typically, the total surface density of fixed and/or trapped charge is kept below $8 \times 10^{-7}$ C·cm$^{-2}$ or, equivalently, the surface number density of charged sites is kept below about $5 \times 10^{12}$ cm$^{-2}$ for a single charged site. A charge density of $8 \times 10^{-7}$ C·cm$^{-2}$ shifts the threshold voltage by about 0.4 V for a gate dielectric with capacitance per unit area in inversion of about $2 \times 10^{-6}$ F·cm$^{-2}$.

Third, the gate electrode structure should not impede charging/discharging of the layer directly adjacent to the gate dielectric, for the speed of such charging/discharging is directly related to the speed of FET switching. Presence of multiple layers in the gate electrode can adversely affect the speed of the gate electrode charging due to the presence of a large interface or contact resistance between the adjacent conductive layers.

Accordingly, it is desirable to keep the interface or contact resistance between the layers in the gate electrode below about $1 \times 10^{-6}$ Ω·cm$^2$, more preferably to below $3 \times 10^{-7}$ Ω·cm$^2$. Indeed, it would take an extra 2 picoseconds to charge a gate dielectric capacitance of about $2 \times 10^{-6}$ F·cm$^{-2}$ through an additional interface resistance of $1 \times 10^{-6}$ Ω·cm$^2$. In addition, the extra charging time associated with the interface resistance can further increase due to an extra parasitic capacitance present at the gate corners below the resistive interface. The gate-to-drain parasitic capacitance can be further multiplied by about a factor of two due to a Miller feedback effect. For short channel transistors with the physical gate length of less than about 40 nm, such extra capacitance can be as large as the gate capacitance itself, effectively doubling extra charging time. The fastest state-of-the-art CMOS circuit (a ring oscillator) has switching time per stage of about several picoseconds enabling more complex circuits operating with electrical pulses as short as 30-100 picoseconds. Therefore, a resistive interface in the gate electrode with interface/contact resistance of more than of $1 \times 10^{-6}$ Ω·cm$^2$ may introduce a substantial extra delay and/or undesirably change the shape of electrical pulse.

High-k based gate dielectrics are competing with conventional silicon oxynitride based dielectrics. Silicon oxide or oxynitride has been a gate dielectric material of choice for more than 30 years. Prior oxynitride based gate dielectrics have (a) a physical thickness of about 1 nm, (b) a capacitance per unit area in inversion of about $2\times10^{-6}$ F·cm$^2$ for a doped polysilicon gate electrode and about $2.2\times10^{-6}$ F·cm$^{-2}$ for a metallic gate electrode, (e) gate tunneling or leakage current of about 200 A/cm$^2$ at 0.8V gate bias, and (d) a fixed or trapped charge of less than $2\times10^{-7}$ C·cm$^{-2}$. It is desirable that a high-k gate dielectric provides a similar or higher capacitance per unit area at a lower gate tunneling or leakage current with an acceptable amount of fixed or trapped charge as alluded above. In addition, a highly preferred high-k gate dielectric provides greater than approximately a 10% increase in the gate capacitance in inversion in comparison to similar oxynitride-based gate dielectrics.

Typical high-k based dielectrics known in the art are comprised of insulating metal oxides such as hafnium oxide (HfO$_2$) and zirconium oxide (ZrO$_2$). In these compounds, a metal-oxygen bond is easily polarizable under an external electric filed yielding a high dielectric constant (high-k). The very same high polarizability of these bonds results in highly undesirable scattering of channel mobile charges by remote phonons present in the high-k material. As the result, the transistor drive current can be substantially reduced by the presence of high-k materials in the gate insulator. Several existing solutions are directed to the reduction of the scattering problem. In one known solution, a silicon material is added to the metal oxide creating a ternary insulating compound known as metal silicate. While a metal silicate creates less scattering by remote phonons, the dielectric constant of metal silicates is typically substantially lower than that of a pure metal oxide. Consequently, a layer of metal silicate should be substantially thinner than that of a pure metal oxide.

In an alternative solution, a layer of silicon oxide or silicon oxynitride is disposed between the channel and the high-k layer. The remote phonon scattering is then reduced because the high-k layer is positioned further away from the channel. It is desirable that the silicon oxynitride layer be thinner than current state-of-the-art silicon-oxynitride-based gate dielectrics in order for such high-k stack to have acceptable gate capacitance as alluded above.

While there are multiple ways of forming metal-oxide-based high-k layers, all of them employ oxidation of metal atoms at the wafer surface by exposing the surface to an oxygen-containing precursor. In one set of methods, the high-k layer is simply deposited from metal and oxygen containing precursors. In another set of methods, the metal layer is first formed on the surface and then oxidized by an oxygen precursor.

One major drawback of prior forming methods for producing metal-oxide-based high-k layers, in which the metal layer is first formed on the surface and then oxidized by an oxygen precursor, is that oxidation of metal competes with the oxidation of semiconductor (silicon) yielding thick insulating film adjacent to the semiconductor with a dielectric constant of below 10. Alternatively, at much reduced overall oxidation rate (e.g., at a low partial pressure of oxidation precursor and/or at a low oxidation temperature), partial oxidation of metal occurs leading to highly undesirable spatial variation of gate dielectric properties such as its' tunneling current, fixed or trapped charge, etc.

In view of the prior art mentioned, there is a need for providing an improved gate stack, which contains a metallic electrode and a high-k dielectric.

SUMMARY

It is an object of the present invention to provide a high-k gate dielectric comprising a continuous ultra-thin high-k metal oxide layer having a thickness of about 15 Å or less.

Another object of the present invention is to provide a method of forming high-k gate dielectrics comprising a continuous ultra-thin high-k metal oxide layer. The term "high-k" denotes a dielectric constant on the order of about 20 or greater. The term "ultra-thin" denotes a thickness on the order of about 15 Å or less. The term "continuous" denotes that the ultra-thin metal oxide layer is substantially free of voids and island formation.

The above objectives of the present invention are achieved by depositing an ultra-thin metal layer atop a dielectric layer comprising silicon and oxygen atoms and then capping the ultra-thin metal layer with an oxygen diffusion barrier, in which the ultra-thin metal layer and the oxygen diffusion barrier are deposited without exposure to an oxidizing environment. During subsequent annealing, the ultra-thin metal layer reacts with the dielectric layer to provide a continuous ultra-thin high-k metal oxide layer. In broad terms, this embodiment for forming the continuous ultra-thin metal oxide layer comprises:

forming a dielectric layer atop a substrate, said dielectric layer comprising at least oxygen and silicon atoms;

forming a layer of metal atoms atop said dielectric layer within a non-oxidizing atmosphere, wherein said layer of metal atoms has a thickness of 15 Å or less;

forming an oxygen diffusion barrier atop said layer of metal atoms, wherein said non-oxidizing atmosphere is maintained;

forming a gate conductor atop said oxygen diffusion barrier; and annealing said layer of metal atoms and said dielectric layer, wherein said layer of metal atoms reacts with said dielectric layer to provide a continuous metal oxide layer having a thickness less than about 15 Å.

The above-described method may be utilized in conventional MOSFET manufacturing, including damascene and replacement gate formation methods. The layer of metal atoms comprises metal atoms that are highly reactive with the underlying dielectric layer. The term "highly reactive" denotes that the metal atoms of the layer of metal atoms getters oxygen atoms from the underlying dielectric layer. The term to "getter oxygen" denotes that the metal atoms bond to the oxygen atoms of the underlying dielectric layer, hence breaking the bonds between silicon and oxygen atoms of the dielectric layer. The metal atoms may comprise titanium or titanium silicide. The layer of metal atoms can be deposited by physical vapor deposition, such as sputter deposition, molecular beam epitaxial deposition, or electron beam deposition. The layer of metal atoms can also be deposited by chemical vapor deposition.

The oxygen diffusion barrier is deposited to ensure that the layer of metal atoms is not exposed to an oxidizing atmosphere. The oxygen diffusion barrier may be a metal with the appropriate work function, wherein the thickness of the oxygen diffusion barrier is modified to ensure its effectiveness as a barrier to oxygen diffusion from an oxidizing atmosphere. Preferably, the oxygen diffusion barrier is an ultra-thin metal nitride. The oxygen diffusion barrier may be deposited by chemical vapor deposition, atomic layer deposition or physical vapor deposition.

The layer of metal atoms and the oxygen diffusion barrier are formed in a non-oxidizing atmosphere, such as an inert vacuum, and may be deposited in-situ. The in-situ deposition process may be performed in a cluster tool having multiple deposition chambers, where the non-oxidizing atmosphere is maintained between the multiple deposition chambers.

In another embodiment of the present invention, an interface layer of metal atoms is deposited atop the oxygen diffusion barrier prior to the deposition of the gate conductor. In this embodiment, the interface layer metal atoms is positioned between the metal nitride oxygen diffusion barrier and the polysilicon gate conductor and ensures that a high resistance dielectric interface, such as silicon nitride or oxide, is not produced between the metal nitride oxygen diffusion barrier and the polysilicon gate conductor. The term "high resistance" denotes that the resistance is greater than about $1\times10^{-6}$ $\Omega\cdot cm^2$.

The incorporation of titanium metal atoms between the metal nitride oxygen diffusion barrier and the polysilicon gate conductor results in the formation of a low resistance titanium silicide or titanium nitride at the interface between the metal nitride oxygen diffusion barrier and the polysilicon gate conductor. Hereafter this layer is referred to as a metal interface layer. The term "low resistance" denotes that the resistance is less than about $1\times10^{-6}$ $\Omega\cdot cm^2$, preferably being less than about $3\times10^{-7}$ $\Omega\cdot cm^2$.

Another aspect of the present invention is a high-temperature gate structure formed using the above-described method. In broad terms, the high-temperature gate structure comprises:

a dielectric layer positioned on a substrate; said dielectric layer having a continuous metal oxide surface, said continuous metal oxide layer having a physical thickness of less than about 15 Å and a dielectric constant ranging from about 25 to about 30;

an oxygen diffusion barrier positioned on said continuous metal oxide surface; and a gate conductor positioned atop said continuous metal oxide layer.

The dielectric layer of the present invention can have an equivalent oxide thickness (EOT) less than about 20 Å. For the purpose of this disclosure an equivalent oxide thickness (EOT) is a measure of gate dielectric capacitance per unit area when the gate is biased to create inversion charge in the channel. EOT is equal to the dielectric constant of silicon dioxide (~0.345 pF/cm) divided by the measured value of capacitance per unit area in inversion. For instance, a capacitance per unit area in inversion of about $2\times10^{-6}$ $F/cm^2$ corresponds to the EOT of about 17.25 Å. This definition of EOT is also known in the art as a capacitance equivalent thickness (CET).

The oxygen diffusion barrier may be a metal nitride layer having a thickness of less than about 100 Å. In another embodiment of the high temperature gate structure, the gate structure further comprises a metal interface layer, such as a metal silicide or metal nitride, positioned at the interface between the gate conductor and the oxygen diffusion barrier. The metal interface layer can have a contact resistance of less than about $1\times10^{-6}$ $\Omega\cdot cm^2$, preferably being less than about $3\times10^{-7}$ $\Omega\cdot cm^2$.

DETAILED DESCRIPTION OF THE INVENTION

Figure 1:
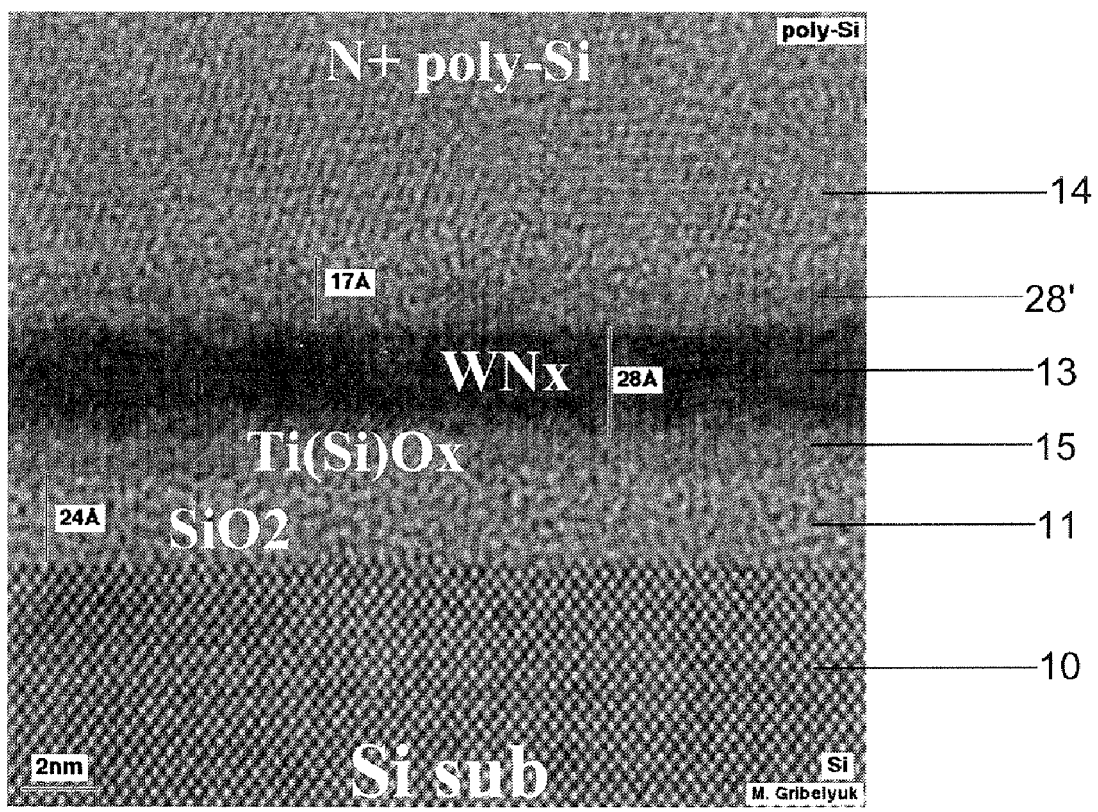
FIG. 1 is a micrograph depicting a cross-section of the gate structure of the present invention, comprising a continuous ultra-thin high-k metal oxide layer.

The present invention provides high-k gate dielectrics comprising uniform continuous ultra-thin high-k metal oxide layers, and a method of forming the same. The present invention advantageously provides a continuous ultra-thin high-k metal oxide layer by depositing a highly reactive layer of metal atoms atop a dielectric surface comprising at least silicon and oxygen atoms and forming an oxygen diffusion barrier atop the layer of metal atoms, in which the highly reactive layer of metal atoms and the oxygen diffusion barrier are formed in a non-oxidizing atmosphere. Following the deposition of a gate conductor atop the oxygen diffusion barrier, the highly reactive metal atom layer completely reacts with the dielectric surface to provide a continuous ultra-thin high-k metal oxide layer during subsequent annealing. Specifically, the metal atoms of the layer of metal atoms bonds with the oxygen atoms of the dielectric layer, thus converting the upper surface of the dielectric layer into a uniform continuous ultra-thin high-k metal oxide layer. The present invention is now discussed in more detail referring to the drawings that accompany the present application. In the accompanying drawings, like and/or corresponding elements are referred to by like reference numbers.

Referring to FIG. 1, a high temperature gate structure, is provided including a dielectric layer 11 comprising at least silicon and oxygen atoms, preferably being $SiO_2$; a continuous ultra-thin high-k metal oxide 15, preferably being $TiSiO_x$; a metal nitride layer 13, preferably being WN; a metal interface layer 28', preferably being Ti silicide; and a gate conductor 14, preferably being $n^+$ polysilicon. The continuous ultra-thin high-k metal oxide 15 may have a thickness ranging from about 3 Å to about 15 Å, even more preferably being about 10 Å. The metal interface layer 28' may have a thickness ranging from about 5 Å to about 50 Å, preferably being less than 30 Å. The ultra-thin metal oxide 15 is advantageously continuous, therefore providing a high capacitance gate dielectric with low leakage characteristics. Although a continuous ultra-thin high-k metal oxide layer 15 is preferred, in which the thickness of the ultra-thin high-k metal oxide layer 15 is less than 15 Å, the thickness of the continuous metal oxide layer 15 may be greater than the "ultra-thin" regime. For instance, the continuous metal oxide layer 15 may have a thickness on the order of 20 Å or less.

Figure 2:
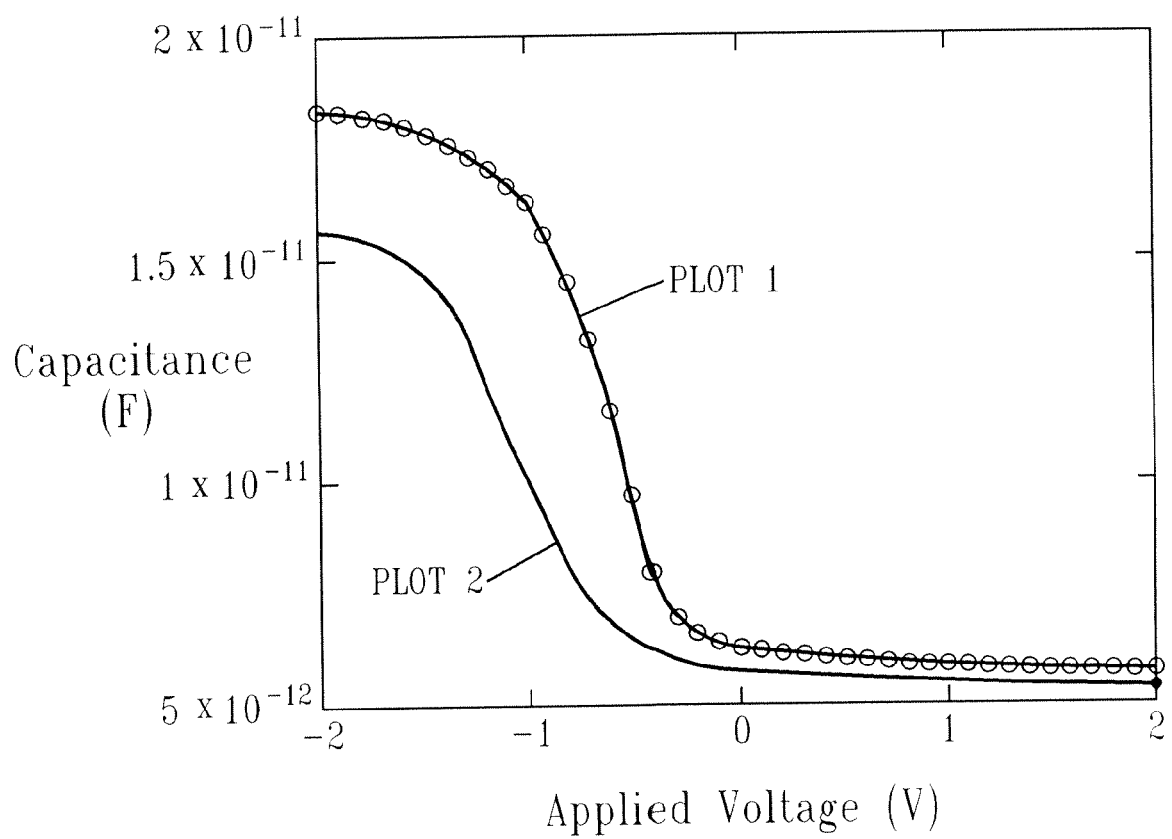
FIG. 2 is a plot of the capacitance (F) v. voltage (V) curve for a gate structure similar to the one depicted in FIG. 1.

Referring to FIG. 2, a capacitance (F) v. voltage (V) plot is provided for one embodiment of the present gate structure comprising a continuous ultra-thin high-k metal oxide layer 15, similar to that depicted in FIG. 1, and a prior gate structure comprising $n^+$ polysilicon. Plot 1 represents the capacitance (F) v. voltage (V) characteristics of one embodiment of the inventive gate structure formed in accordance with the present invention. Specifically, the gate structure depicted in plot 1 is a stack comprising an $n^+$ polysilicon gate conductor 14, Ti silicide metal interface layer 28, WN metal nitride layer 13, $TiSiO_x$ continuous ultra-thin high-k metal oxide layer 15, and $SiO_2$ gate dielectric 11. The $TiSiO_x$ continuous ultra-thin high-k metal oxide 15 has a thickness on the order of about 10 Å and the $SiO_2$ gate dielectric has a thickness on the order of about 15 Å. The gate structure depicted in plot 2 is a comparative example of a prior gate region comprising $n^+$ polysilicon.

Still referring to FIG. 2, the gate structure formed in accordance with the present invention, depicted by plot 1, yielded a maximum capacitance of about $1.8 \times 10^{-11}$ F. The prior gate structure comprising n+ polysilicon, depicted in plot 2, yielded a maximum capacitance of about $1.6 \times 10^{-11}$ F for the same area capacitor. Hence, there is a 10% gain in capacitance for gate structures formed in accordance with the present invention.

Still referring to FIG. 2, it is clear that the inventive gate structure, depicted in plot 1, comprising a continuous high-k ultra-thin metal oxide layer 15 produces a higher capacitance than the prior gate structure, depicted in plot 2.

Gate dielectrics incorporating the continuous ultra-thin high-k metal oxide layer 15 of the present invention can be overall thicker than prior gate dielectrics having a lower dielectric constant (k), but yet can still maintain a high capacitance. Thicker gate dielectrics typically result in less leakage and therefore result in less power dissipation by a circuit. The method for forming the present gate structure is now described in greater detail referring to FIGS. 3-8.

Figure 3:
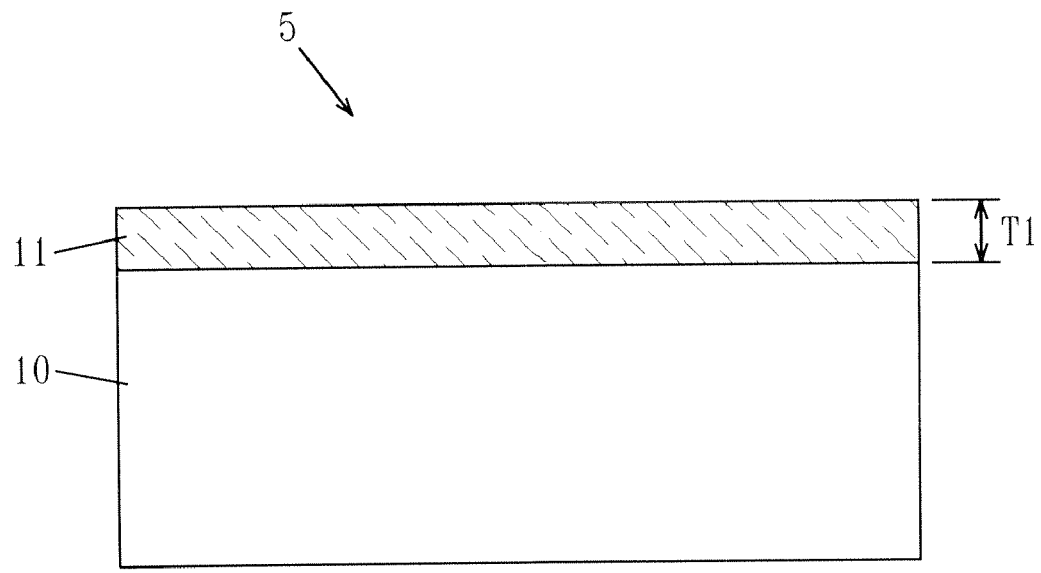
FIGS. 3-8 illustrate (through cross-sectioned view) the process steps for producing the gate dielectric depicted in FIG. 1.

Referring to FIG. 3, an initial structure 5 is first provided comprising a dielectric layer 11 atop a substrate 10, in which the dielectric layer 11 comprises at least silicon and oxygen atoms. The substrate 10 includes, but is not limited to: any semiconducting material such as Si, amorphous Si, strained Si, SiGe, GaAs, InAs and other like semiconductors. Layered semiconductors such as Si/Ge and Silicon-On-Insulators are also contemplated herein. Prior to dielectric layer 11 formation, the surface of the substrate 10 may be cleaned using a chemical cleaning process. In one example, the substrate 10 surface may be cleaned using a wet pre-clean comprising a $NH_4OH$, $H_2O_2$, and $H_2O$ mixture followed by another wet cleaning step comprising HCl, $H_2O_2$, and $H_2O$. The pre-clean step may optionally be concluded with an HF dip.

The dielectric layer 11 may be formed atop the substrate 10 using forming methods including, but not limited to: rapid thermal growth or chemical oxide growth. Preferably, the dielectric layer 11 may be formed by thermal oxidation in a NO atmosphere for a time period on the order of about 10 seconds, at a temperature ranging from about 600° C. to about 1000° C. The dielectric layer 11 comprises at least oxygen and silicon atoms. In a highly preferred embodiment, the dielectric layer 11 is silicon oxynitride, e.g. $Si_xO_yN_z$, having a physical thickness T1 of less than about 25 Å, more preferably less than 18 Å, and even more preferably ranging from about 12 Å to about 15 Å. Alternatively, the dielectric layer 11 is preferably an oxide, such as $SiO_2$.

The dielectric layer 11 preferably has an equivalent oxide thickness (EOT) on the order of about 20 Å when the device, in which the dielectric layer 11 is integrated, is in inversion. The term "inversion" denotes that an electrical current is provided that switches the device into the "on" state. It is possible with high-k dielectrics to provide the capacitance of lower k dielectrics but at a greater thickness.

Figure 4:
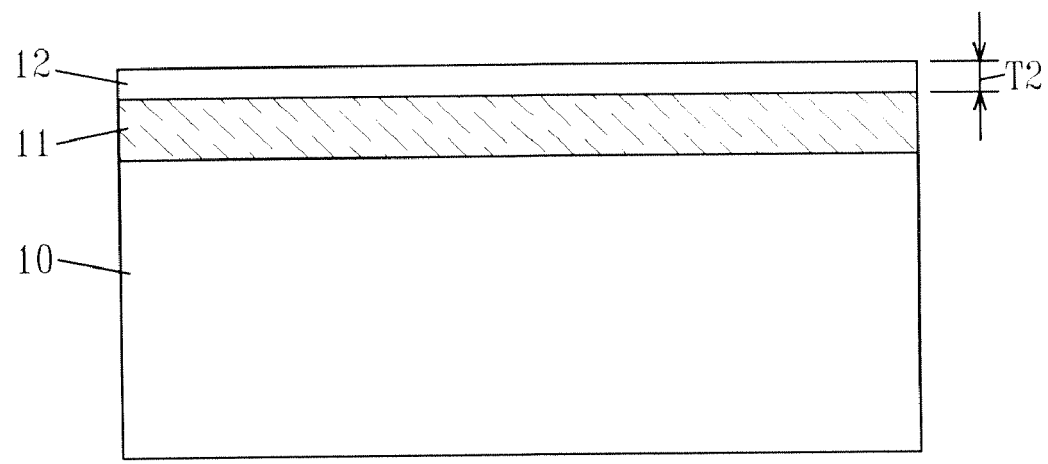

Referring now to FIG. 4, an ultra-thin layer of metal atoms 12 (hereafter referred to as an ultra-thin metal layer) is then deposited atop the dielectric layer 11. The metal atoms of the ultra-thin metal layer 12 are highly reactive with the underlying dielectric layer 11. Specifically, during subsequent annealing, the metal atoms of the ultra-thin layer of continuous metal atoms 12 getter oxygen atoms from the underlying dielectric layer 11, in which the metal atoms bond with the oxygen of the dielectric layer 11, thus breaking bonds between silicon and oxygen atoms of the dielectric layer 11. In a highly preferred embodiment, the metal atoms of the ultra-thin layer of metal atoms 12 comprise titanium or titanium silicide.

The ultra-thin layer of metal atoms 12 has a physical thickness T2 ranging from about 2 Å to about 20 Å, even more preferably being about 2 Å to about 15 Å, and even more preferably being about 7 Å. The ultra-thin layer of metal atoms 12 may comprise 1 monolayer to about 5 monolayers. The ultra-thin layer of metal atoms 12 may comprise $1 \times 10^{14}$ atoms/cm² to about $1 \times 10^{16}$ atoms/cm².

The thickness T2 of ultra-thin metal layer 12 should be at least twice thinner than the thickness T1 of pre-grown dielectric layer 11. This will ensure that only a portion of dielectric layer 11 is converted into a high-k compound. Further, access of highly-reactive metal atoms may bond with remaining silicon atoms forming a very leaky dielectric or even a conductor. For instance, in the case of titanium layer, a titanium silicide compound is a conductor while a titanium oxide is a dielectric. Accordingly, the presence of a large amount of Si—Ti bonds as compared to the Ti—O bonds in the Ti—Si—O compound will increase leakage and eventually make can Ti—Si—O conductive. It has been discovered that by reacting titanium with silicon oxide, Ti—Si—O can be kept substantially dielectric if amount of titanium atoms (per unit area) is limited to below about ⅓ of the amount of oxygen atoms (per unit area) present in the dielectric layer 11.

The ultra-thin layer of metal atoms 12 is deposited in a non-oxidizing atmosphere utilizing a chemical vapor deposition or physical vapor deposition (PVD) method, including sputter deposition, molecular beam epitaxial deposition, or electron beam deposition. During deposition, the pressure may range from about 1 Torr to about $0.1 \times 10^{-3}$ Torr.

For the purpose of the present application, a non-oxidizing ambient is defined as having a partial pressure of all oxidizing species, such as oxygen ($O_2$), water vapor ($H_2O$), OH radical, NO, $N_2O$, or ozone, of below $1 \times 10^{-4}$ Torr. It is noted that other molecules, reactive or neutrals, can be present in the non-oxidizing ambient at a substantially higher partial pressure.

A preferred deposition method for the ultra-thin layer of metal atoms 12 is CVD (Chemical Vapor Deposition) where a metal precursor gas, such as $TiCl_4$, is dissociated at the dielectric layer 11 surface at a relatively low temperature of about 400° C. A neutral carrier gas, such as nitrogen or hydrogen, can be added to the CVD reactive ambient to assist in transporting reactive molecules. Alternatively, the ultra-thin layer of metal atoms 12 can be deposited by PVD (Physical Vapor Deposition) with low energy ions to prevent any ion-induced damage to the dielectric layer 11. One example of such a PVD process is a lower power sputtering system, where a metallic target bias does not exceed about 100V peak-to-peak.

Figure 5:
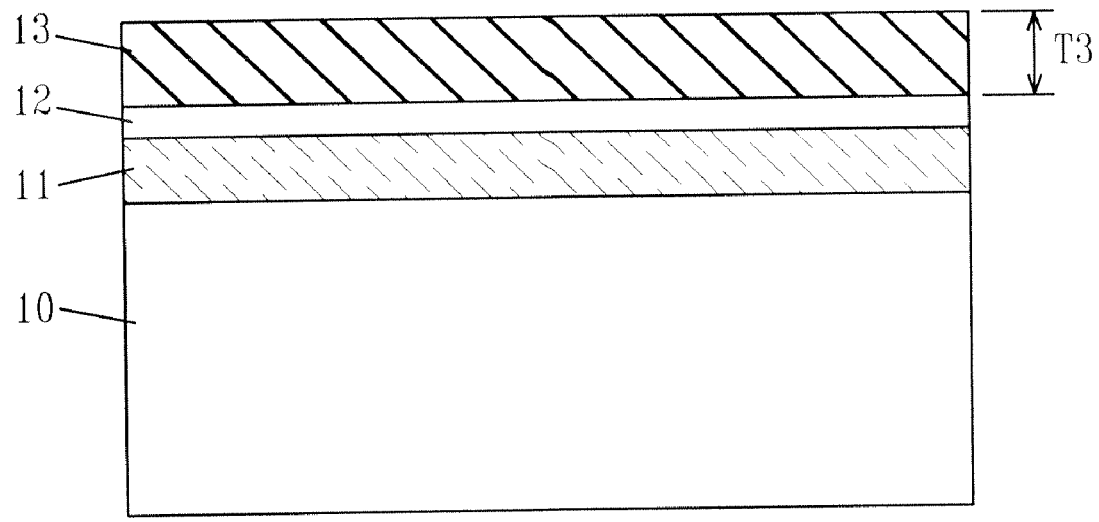

Referring to FIG. 5, an oxygen diffusion barrier 13 may then be formed atop the ultra-thin layer of metal atoms 12 by a deposition method in a non-oxidizing atmosphere. The oxygen diffusion barrier 13 may comprise metals or metal nitrides that can protect the ultra-thin layer of metal atoms 12 from oxidation via an oxidizing atmosphere. Preferably, the oxygen diffusion barrier 13 comprises metal nitrides such as titanium nitride (TiN), tungsten nitride (WN) and tantalum nitride (TaN), most preferably being titanium nitride (TiN). The metal nitride oxygen diffusion barrier 13 can have a thickness T3 on the order of about 100 Å, preferably being 50 Å. Alternatively, the oxygen diffusion barrier 13 may be a metal having a work function appropriate to the threshold voltage of the subsequently formed device, wherein the thickness of the metal layer ensures that the ultra-thin layer of metal atoms 12 is not oxidized by an oxidizing atmosphere. Examples of metals that may provide the oxygen diffusion barrier 13 include W, Re, Ir, and Ta.

The deposition method can include chemical vapor deposition (CVD) or physical vapor deposition (PVD). The chemical vapor deposition (CVD) method may include atomic layer deposition (ALD), plasma-enhanced chemical vapor deposition (PECVD) or low-pressure chemical vapor deposition (LPCVD). The physical vapor deposition (PVD) method can include sputter deposition, molecular beam epitaxial deposition, or electron beam deposition.

The preferred deposition method of oxygen diffusion barrier 13 is chemical vapor deposition (CVD). Specifically, if oxygen diffusion barrier 13 is a metal nitride, the preferred deposition method is atomic layer deposition (ALD) or pulse CVD. In the pulsed CVD (ALD), nitrogen and metal precursors are pulsed one after each other with optional neutral gas added in between the pulsing steps. In the highly preferred case of WN, tungsten precursor is $W(CO)_6$ and nitrogen precursor is ammonia ($NH_3$).

The non-oxidizing atmosphere first present during ultra-thin metal layer 12 deposition is maintained through deposition of the oxygen diffusion barrier 13. The oxidation of the ultra-thin layer of metal atoms 12 prior to, or during oxygen diffusion barrier 13 formation, can result in reaction-limited oxidation. Reaction-limited oxidation typically results in a rough deposition surface providing poor quality gate dielectrics, which can result in the oxidation of the substrate 10, thickening T1 the dielectric layer 11.

Figure 6:
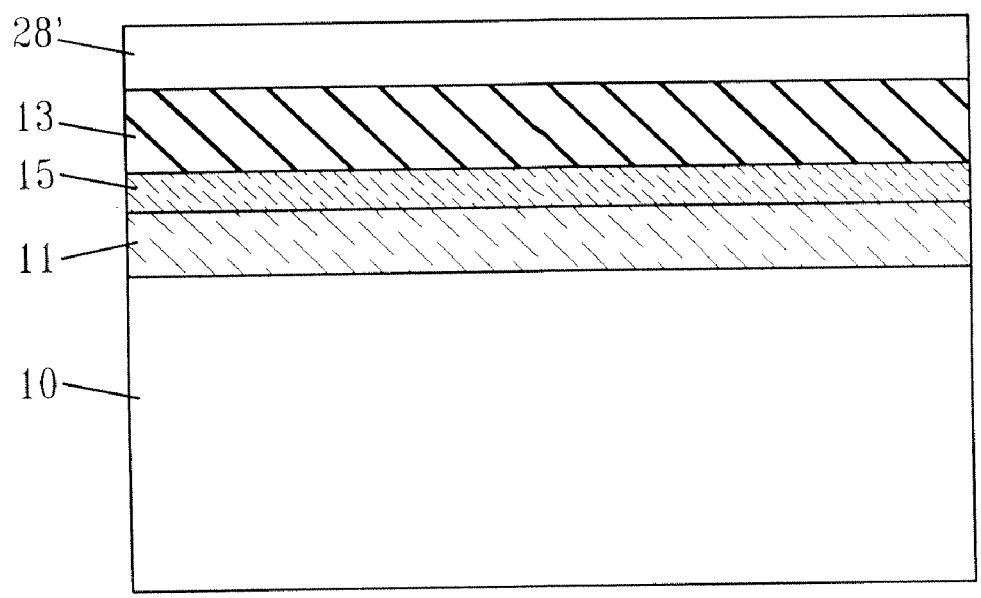

Referring to FIG. 6, an interface layer of metal atoms 28 may be deposited atop the oxygen diffusion barrier 13 prior to the deposition of the gate conductor. The incorporation of the interface layer of metal atoms 28 ensures that a low resistance interface is formed between the gate conductor 14 and the oxygen diffusion barrier 13.

In prior gate structures, a polysilicon gate conductor formed atop a nitride-containing layer, such as TaN, TiN, or WN, produces a high resistance dielectric layer at the interface between the polysilicon gate conductor and a nitride-containing layer, such as an oxygen diffusion barrier, during subsequent annealing processes. For example, a polysilicon gate electrode positioned on a nitride-containing layer can produce a high resistance silicon nitride layer at the interface between a polysilicon gate conductor and a nitride containing dielectric. The term "high resistance" denotes a contact resistance of greater than about $1 \times 10^{-6}$ $\Omega \cdot cm^2$.

In one embodiment of the present invention, high resistance interface layers between the gate conductor and the oxygen diffusion barrier 13 are substantially eliminated by depositing an interface layer of metal atoms 28 prior to the deposition of the gate conductor. In this embodiment, the layer of continuous metal atoms is positioned between the oxygen diffusion barrier 13, e.g., metal nitride layer, and the polysilicon gate conductor and ensures that a high resistance dielectric layer, such as silicon nitride, is not produced at the interface between the metal nitride oxygen diffusion barrier 13 and the polysilicon gate conductor 14. The interface layer of metal atoms 28 may comprise Ta, Ti, Hf or W, the preferred interface layer of metal atoms 28 comprising Ti. The incorporation of the layer of Ti atoms between the oxygen diffusion barrier 13, e.g., metal nitride layer, and the polysilicon gate conductor 14 results in the formation of a low resistance titanium silicide or titanium nitride at the interface between the oxygen diffusion barrier and the polysilicon gate conductor. The interface layer of metal atoms 28 may be deposited to a thickness of less than about 50 Å. Preferably, the interface layer of metal atoms has a thickness ranging from about 10 Å to about 50 Å, more preferably ranging from about 10 Å to about 20 Å, even more preferably being less than 15 Å.

Similar to the ultra-thin layer of metal atoms 12, the interface layer of metal atoms 28 is deposited in a non-oxidizing atmosphere by a chemical vapor deposition (CVD) method or physical vapor deposition (PVD) method. Specifically, the deposition method for the formation of the interface layer of metal atoms 28 is CVD, where a metal precursor gas, such as $TiCl_4$, is dissociated at the wafer surface at a relatively low temperature of about 400° C. A neutral carrier gas such as nitrogen or hydrogen can be added to the CVD reactive ambient to assist in transporting reactive molecules. Alternatively, the interface layer of metal atoms 28 can be deposited by PVD (Physical Vapor Deposition) with low energy ions to prevent any ion-induced damage to the oxygen diffusion barrier 13. One example of such PVD is a lower power sputtering system where a metallic target bias does not exceed about 100 V peak-to-peak.

During subsequent high temperature annealing, the interface layer of metal atoms 28 forms a low resistance metal interface layer 28' between the gate conductor and the oxygen diffusion barrier 13. The term "low resistance" denotes a contact resistance of less than about $1 \times 10^{-6}$ $\Omega \cdot cm^2$, preferably being less than $3 \times 10^{-7}$ $\Omega \cdot cm^2$. The interface layer of metal atoms may be converted to low resistance metal interface layer 28' comprising a metal silicide or a conductive metal nitride. For example, when the interface layer of metal atoms 28 comprises titanium, the metal interface layer 28' may be titanium nitride and/or titanium silicide. It is noted that the low resistance metal interface layer 28' may be omitted.

Figure 7A:
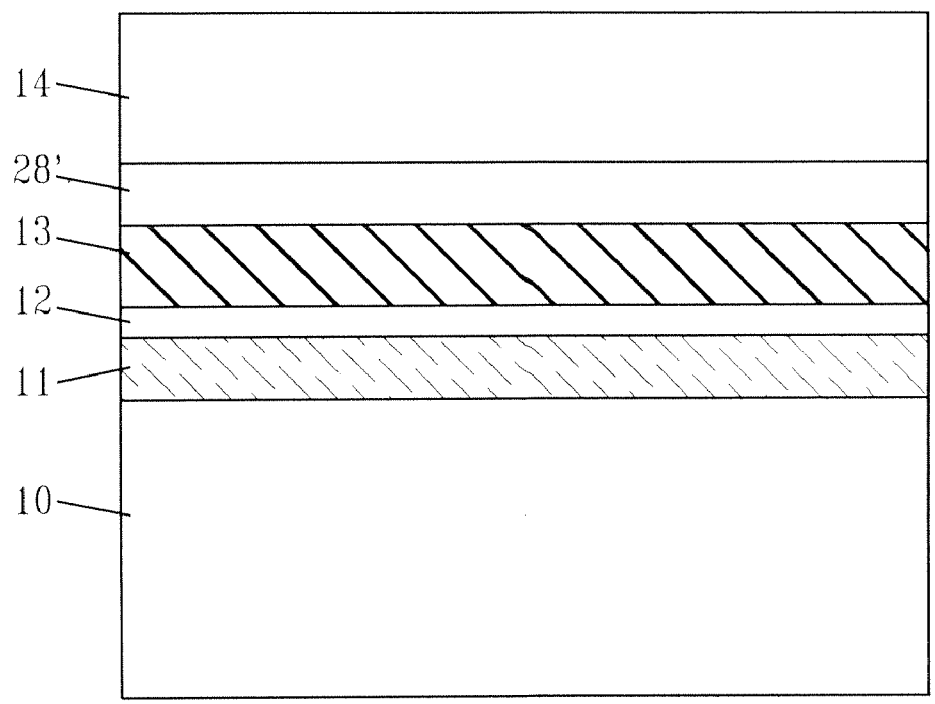
Figure 7B:
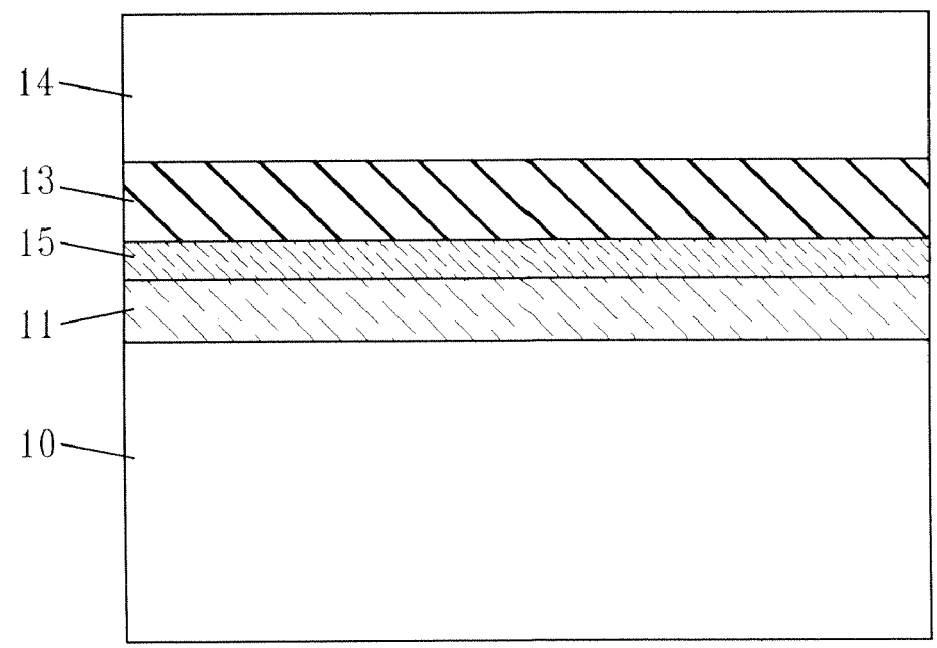

Referring to FIG. 7(a), a gate conductor 14 is then formed atop the interface layer of metal atoms 28. In the embodiment in which the interface layer of metal atoms 28 is omitted, the gate conductor 14 is formed atop the oxygen diffusion barrier 13, as depicted in FIG. 7(b).

The gate conductor may be formed by a deposition process, such as chemical vapor deposition (CVD), physical vapor deposition (PVD) or atomic layer deposition (ALD). Preferably, the deposition process is CVD. The gate conductor 14 may comprise any conductive material including, but not limited to: polysilicon; a conductive elemental metal such as W, Pt, Ru, Ir, Rh, Mo, Ni, and Re; alloys that include at least one of the aforementioned conductive elemental metals; silicides that include at least one of the above-mentioned conductive elemental metals; and combinations thereof. A highly preferred conductive material employed as the gate conductor 14 is doped polysilicon having a metal silicide positioned on the upper surface.

The preferred deposition method for the polysilicon gate conductor 14 is CVD. Specifically, either rapid thermal CVD (RTCVD) or low pressure CVD (LPCVD) can be used for this purpose. Silicon precursor can be either silane ($SiH_4$), in the case of RTCVD or dichlorosilane ($SiCl_2H_2$), in the case of LPCVD. Hydrogen ($H_2$) and neutral gases can be also added to the mixture. For a highly-preferred in-situ doped polysilicon, dopant precursors can be also added to the deposition ambient. $PH_3$, $AsH_3$, $B_2H_6$ can be used as a source of P, As, or B dopants, respectively. The deposition ambient can further comprise non-oxidizing gasses, such as Ar, $N_2$ or He.

The polysilicon gate conductor 14 is typically silicided at the top to form a highly conductive gate conductor 14. A highly preferred silicide is nickel monosilicide (NiSi). NiSi silicide is formed in a two-step metal reaction with polysilicon at a temperature not exceeding 500° C., as commonly known in the art. The access of unreacted metal can be removed selective to the silicide in a solution sulfuric acid, for example. It is noted that the inventive structure permits complete silicidation of polysilicon gate conductor 14 without any interference between the gate dielectric 11, 12 and the formed silicide. Thicker silicide is highly desirable, since it results in a lower gate conductor resistance.

In the embodiments of the present invention in which the interface layer of metal atoms 28 is deposited between the gate conductor 14 and the oxygen diffusion barrier 14, the non-oxidizing atmosphere present during the deposition of the interface layer of metal atoms 28 is maintained through deposition of the gate conductor 14. The oxidation of the interface layer of metal atoms 28 can increase the contact resistance of the metal interface layer 28'.

Figure 8A:
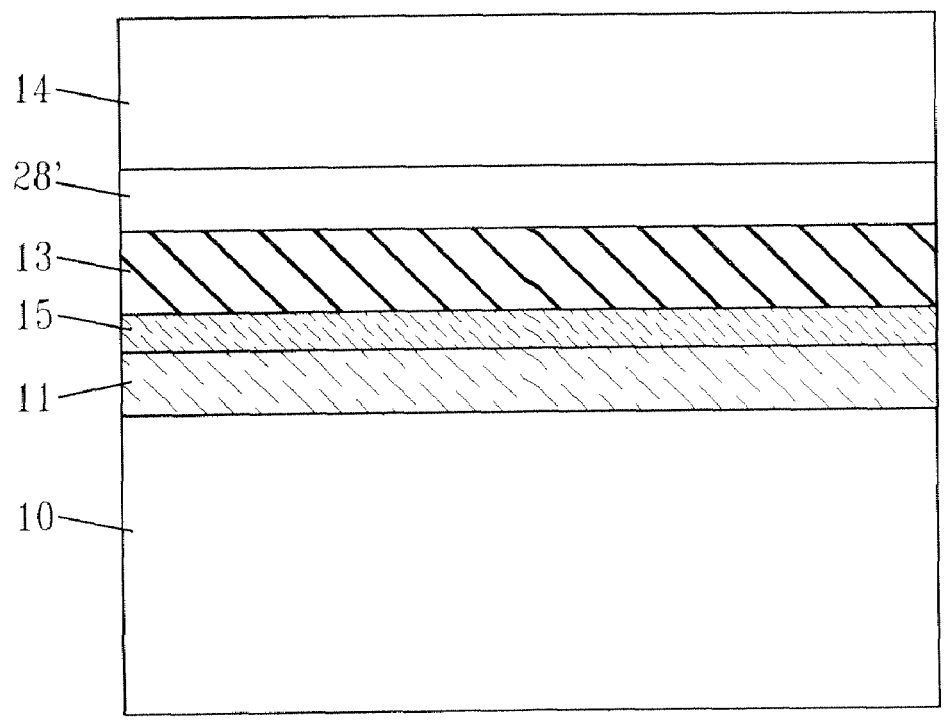
Figure 8B:
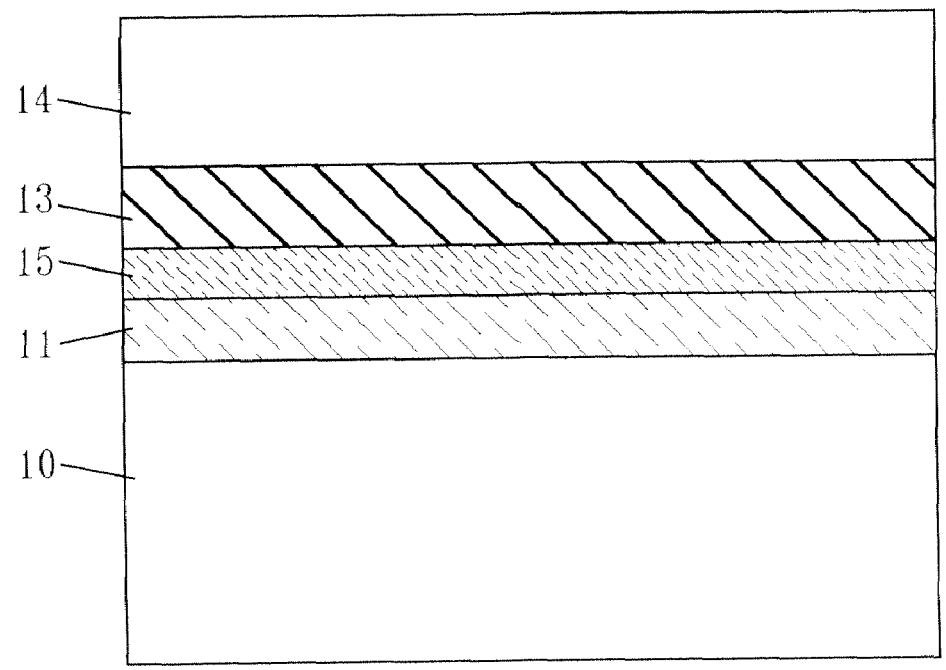

Referring to FIGS. 8(a) and (b), following gate conductor 14 deposition the film stack comprising the gate conductor 14, the ultra-thin layer of metal atoms 12, the oxygen diffusion barrier 13 and the optional interface layer of metal atoms 28 is annealed at a high temperature. High temperature annealing may be conducted by thermal processing, such as rapid thermal anneal or furnace anneal. The annealing temperature may range from about 400° C. to about 1300° C. for a time period of about $1\times10^{-6}$ seconds to about 20.0 seconds. Preferably, the annealing may be source/drain activation annealing at 1000° C., in an atmosphere that can comprise $N_2$, Ar, or $N_2/O_2$ mixed ambient for a time period on the order of about 5 seconds or below. Similar annealing temperatures are used in other annealing processes.

As discussed above, during high temperature annealing of the ultra-thin layer of metal atoms 12 getters oxygen atoms from the underlying dielectric layer 11, wherein the metal atoms bond to the oxygen atoms of the underlying dielectric layer 11, hence breaking the bonds between silicon and oxygen atoms of the dielectric layer 11. Therefore, during high temperature annealing the upper surface of the underlying dielectric layer 11 is converted to an ultra-thin continuous high-k dielectric (metal oxide) 15. For example, during annealing of the ultra-thin layer of titanium metal atoms 12 can react with the upper portion of the underlying 15 Å thick $Si_xO_yN_z$ dielectric layer 11 to provide a TiSiON ultra-thin continuous high-k metal oxide 15 having a thickness ranging from about 10 Å to about 14 Å, wherein an unreacted portion of the $Si_xO_yN_z$ dielectric layer 11 remains having a thickness ranging from about 7 Å to about 10 Å. The thickness of the ultra-thin continuous high-k metal oxide dielectric 15 is dependent on the number of metal atoms in the ultra-thin layer of metal atoms 12. An ultra-thin continuous high-k metal oxide 15, such as TiSiON, can have a dielectric constant (k) on the order of about 25 to about 30.

Further, during annealing the interface layer of metal atoms 28 reacts with the oxygen diffusion barrier 13 and the gate conductor 14 to provide a metal interface layer 28'. For example, an interface layer of titanium metal atoms 28 can react with a metal nitride oxygen diffusion barrier 13 and a polysilicon gate conductor 14 to provide a metal interface layer 28' comprising titanium silicide and/or titanium nitride. The metal interface layer 28' may also be tungsten silicide, tantalum silicide, or tantalum nitride.

The ultra-thin layer of metal atoms and the oxygen diffusion barrier are formed in a non-oxidizing atmosphere and may be deposited in-situ. The in-situ deposition process may be performed in a cluster tool having multiple deposition chambers, where the non-oxidizing atmosphere is maintained between the multiple deposition chambers.

The above method can be performed in-situ using a cluster tool having multiple deposition chambers connected by transfer chambers. In this embodiment, the cluster tool is attached to a high vacuum, in which the vacuum maintains the non-oxidizing atmosphere within each of the deposition and transfer chambers. In one embodiment, the cluster tool comprises a separate deposition chamber for each layer. For example, the cluster tool may include an ultra-thin layer of metal atoms deposition chamber, a gate conductor deposition chamber, an oxygen diffusion barrier deposition chamber and optionally an interface layer of metal atoms deposition chamber. Alternatively, the deposition of the ultra-thin layer of metal atoms 12, the gate conductor 14, the oxygen diffusion barrier 13, and optionally the interface layer of metal atoms may be conducted in-situ in a single deposition chamber by switching precursor gasses.

Figure 9:
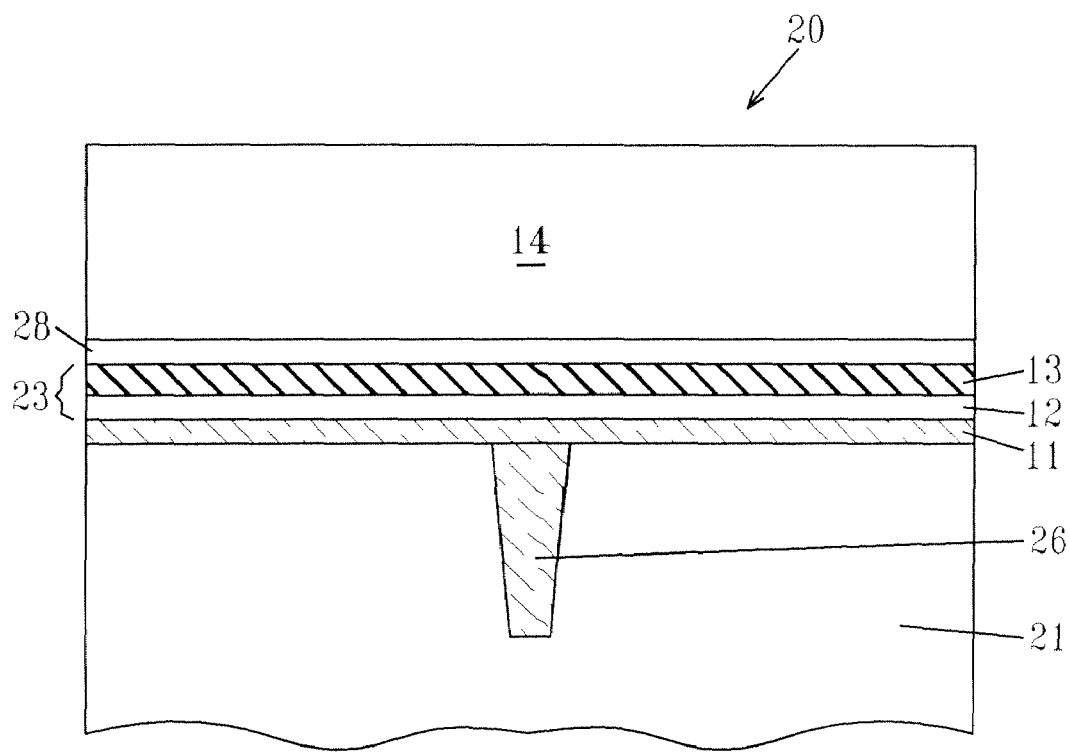
FIGS. 9-10 illustrate (through cross-sectional view) the process depicted in FIGS. 3-8 integrated into a damascene gate forming process.

The above method may be incorporated into a conventional field effect transistor manufacturing processing including damascene formation methods. Referring to FIG. 9, an initial structure 20 may be provided including a substrate 21, a dielectric layer 11, a metal stack 23, and a polysilicon gate conductor layer 14. The initial structure is formed in accordance with the above-described method. To reiterate, the substrate 21 includes, but is not limited to: any semiconducting material such as Si, SiGe, GaAs, InAs and other like semiconductors. Layered semiconductors such as Si/Ge and silicon-on-insulators are also contemplated herein. Preferably, the substrate 21 further comprises isolation regions 26 formed using conventional processing steps. The isolation regions 26 may comprise trench isolation regions, such as shallow trench isolation regions (STI).

The trench isolation regions are formed by etching a trench in the substrate utilizing a dry etching process, such as reactive-ion etching (RIE) or plasma etching. The trenches may optionally be lined with a liner material, e.g., an oxide, and then CVD or another like deposition process is used to fill the trench with oxide grown from tetraethylorthosilicate (TEOS) precursors, high-density oxide or another like trench dielectric material. After trench dielectric fill, the structure may be subjected to a planarization process. In some embodiments, the trench dielectric may be densified after planarization.

Following the formation of the trench isolation regions 26, the dielectric layer 11 may be formed on the upper surface of the substrate 21 in a non-oxidizing atmosphere, as described in the above method steps, which correspond to FIG. 3. Preferably, the dielectric layer 11 comprises $SiO_2$ or SiON and has a thickness of less than about 15 Å. A metal stack 23 is then formed atop the dielectric layer 11. The metal stack 23 comprising the ultra-thin layer of metal atoms 12 and the oxygen diffusion barrier 13 is formed in a non-oxidizing atmosphere in a manner similar to above-described method steps that correspond to FIGS. 4 and 5. The gate conductor 14 is then formed atop the metal stack 23. One highly preferred conductive material utilized for the gate conductor 14 is doped polysilicon. It is noted that oxidation prior to oxygen diffusion barrier 13 deposition can disadvantageously oxidize the substrate 10 resulting in thickening of the dielectric layer 11.

In a highly preferred embodiment of the present invention, an interface layer of metal atoms 28 is deposited atop the oxygen diffusion barrier 13 prior to gate conductor formation. The interface layer of metal atoms 28 is formed as described above with reference to FIG. 6. The interface layer of metal atoms 28 may be omitted.

Figure 10:
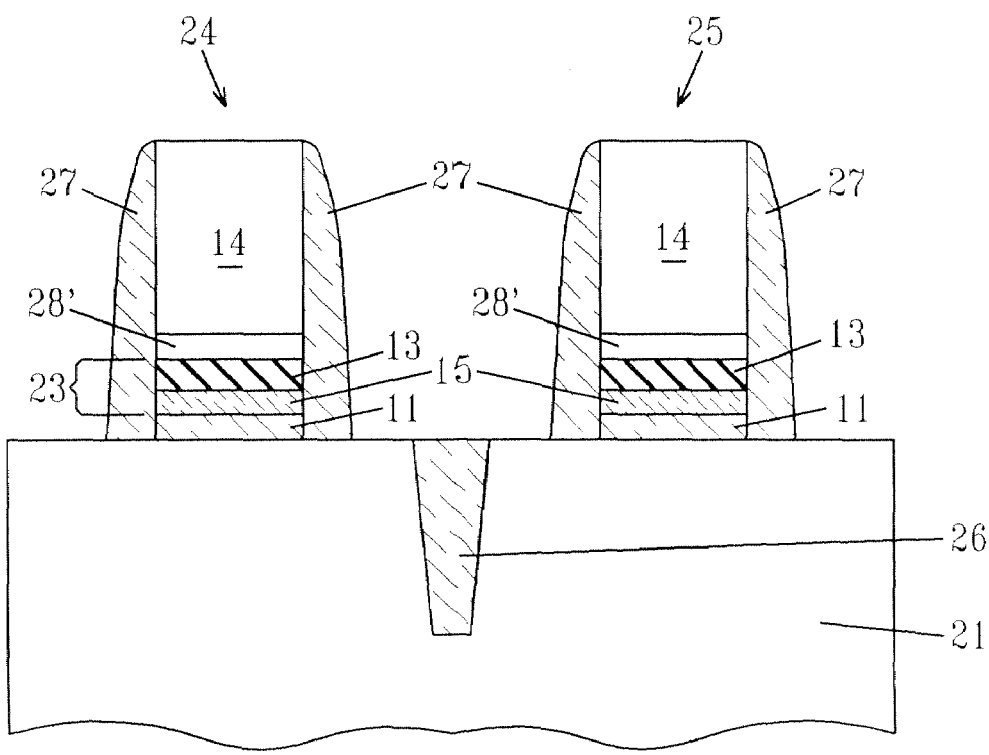

Referring now to FIG. 10, gate region 24, 25 are then formed utilizing photolithography and etching. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process.

Following etching, gate sidewall spacers 27 are formed abutting the gate regions 24, 25. The gate sidewall spacers 27 may comprise dielectric materials, such as oxides, nitrides, oxynitrides, or combinations thereof. The polysilicon gate conductor 14 may then be selectively doped to provide n-type and p-type gate regions. The transistors may be selectively ion implanted to form source/drain and extension regions by utilizing photoresist block masks and offset spacers, as commonly understood in the art.

In a next process step, a high temperature anneal can be provided by a thermal process, such as a rapid thermal anneal. During high temperature annealing, the ultra-thin metal layer 12 converts the upper portion of the underlying dielectric layer 11 into a continuous ultra-thin high-k metal oxide layer 15. In the embodiments of the present invention in which the interface layer of metal atoms 28 is deposited prior to gate conductor 14 formation, the annealing process further converts the interface layer of metal atoms 28 into a low contact resistance metal interface layer 28' between the gate conductor 14 and the oxygen diffusion barrier 13, wherein the low contact resistance metal interface layer 28' may comprise a metal nitride or metal silicide. The high temperature anneal also activates transistor dopants forming the p-n junctions. A silicidation step is then performed, where a portion or the entire gate conductor 14 is converted into silicide. The silicide is also formed on the source/drain regions. A highly preferred silicide is nickel silicide.

In another embodiment of the present invention, the above method of forming a continuous ultra-thin high-k metal oxide dielectric 15 may be incorporated into a replacement gate forming method for metal oxide semiconductor field effect transistors (MOSFET) manufacturing.

Figure 11:
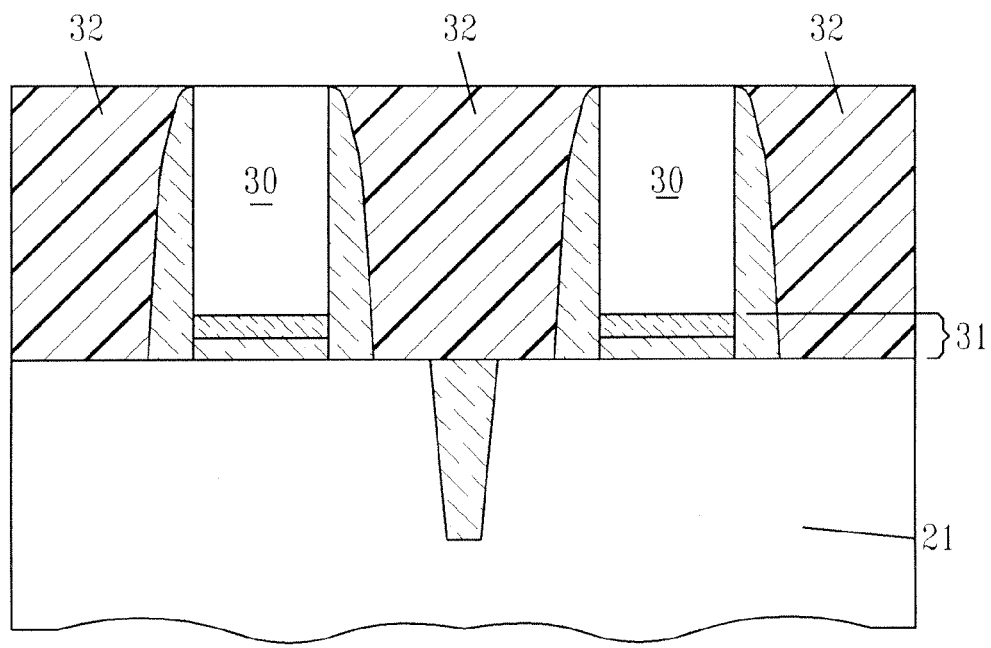
FIGS. 11-12 illustrate (through cross-sectional view) the process depicted in FIGS. 3-8 integrated into a replacement gate forming process.

Referring to FIG. 11, dummy gate regions 30 are first formed atop a substrate 21 using a process similar to that which corresponds with FIGS. 9 and 10. The dummy gate regions 30 may comprise polysilicon dummy gates 30 formed atop an etch stop layer 31. The etch stop layer 31 may be a single layer or multiple layers of oxide, nitride or oxynitride formed using thermal oxidation or nitridation or deposited using deposition processes, such as chemical vapor deposition. In one embodiment, the etch stop 31 may comprise a continuous high-k metal oxide layer deposited using CVD or formed in accordance with the above-described method that corresponds to FIGS. 3-6.

Referring back to FIG. 11, following the formation of the dummy gate regions 30 a masking layer 32, such as a dielectric material or a resist, preferably a high-density plasma oxide, is deposited atop the entire substrate and planarized by chemical mechanical polishing (CMP) or another like process until the top surface of the dummy gate region 30 is exposed. The masking layer 32 is hereafter referred to as a cap dielectric layer 32.

Dummy gate regions 30 are then removed using a wet or dry etch process that is selective to the cap dielectric layer 32 and the top surface of the substrate 10. The etch process may be a single step etch that removes both the dummy gate 30 and the etch stop layer 31. Preferably, a first etch composition removes the polysilicon of the dummy gate 30 selective to the etch stop layer 31 and a second etch composition removes the etch stop layer 31 selective to the substrate 10. Typically, the etch stop layer 31 is removed with dilute HF or by a chemical oxide removal (COR) process, in which a plasma or vapor of HF and ammonia is employed. A chemical pre-clean surface preparation follows the removal of the etch stop layer 19. The openings formed following removal of the dummy gates 30 may be referred to as gate channels.

Figure 12:
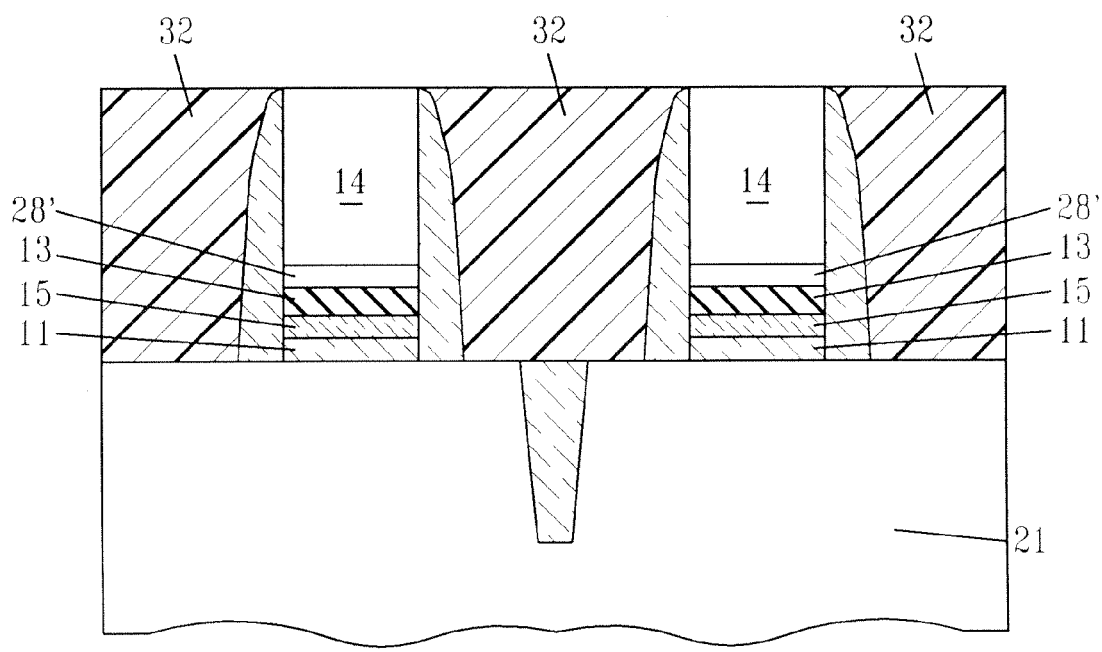

Turning to FIG. 12, a dielectric layer 11 is then formed within the gate channels and atop the exposed substrate 21 by a thermal oxidation, nitridation or oxynitridation process. Preferably, the dielectric layer 11 comprises $SiO_2$ or SiON and has a thickness of less than about 20 Å. In one highly preferred embodiment, the dielectric layer comprises SiON and has a thickness of less than about 15 Å.

A metal stack comprising the ultra-thin metal layer and the oxygen diffusion barrier 13, e.g., metal nitride, is then formed atop the gate dielectric 11. In accordance with the above-described method, the metal stack is formed in a non-oxidizing atmosphere, similar to above-described method steps, which correspond to FIGS. 4 and 5.

Referring back to FIG. 10, a gate conductor 14 is then formed in a non-oxidizing atmosphere atop the metal stack. The gate conductor 14 may comprise any conductive material, preferably polysilicon. When a polysilicon gate conductor is employed, the polysilicon gate conductor is formed by deposition, planarization, and ion implantation. In one embodiment, an interface layer of metal atoms may be deposited prior to the formation of the gate conductor 14.

In a next process step, a high temperature anneal can be provided by a thermal process, such as a rapid thermal anneal. During the high temperature anneal the ultra-thin layer of metal atoms reacts with the dielectric layer 11, wherein the upper portion of the dielectric layer 11 is converted into a continuous ultra-thin high-k metal oxide layer 15. It is noted that oxidation prior to gate conductor 14 deposition can disadvantageously thicken the dielectric layer 11. In the embodiments of the present invention that include the interface layer of metal atoms, the interface layer of metal atoms reacts with the oxygen diffusion barrier 13 and the gate conductor 14 to provide a low contact resistance metal interface layer 28'.

While the present invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A gate structure comprising:
    a dielectric layer positioned on a substrate; said dielectric layer having a continuous metal oxide surface, said continuous metal oxide surface being composed of titanium, silicon and oxygen and having a physical thickness of less than about 15 Å and a dielectric constant ranging from about 25 to about 30;
    an oxygen diffusion barrier positioned on said continuous metal oxide surface; and
    a gate conductor positioned atop said continuous metal oxide surface.

2. The gate structure of claim 1 further comprising a metal interface layer positioned between said oxygen diffusion barrier and said gate conductor, said metal interface layer having a contact resistance less than about $1 \times 10^{-6}$ $\Omega \cdot cm^2$.

3. The gate structure of claim 1 wherein said gate dielectric layer comprises $SiO_2$ or SiON and has an EOT of less than about 20 Å.

4. The gate structure of claim 1 wherein said gate dielectric layer comprises a lower portion underlying said continuous metal oxide surface, wherein said lower portion of said gate dielectric layer has a thickness of less than about 10 Å.

5. The gate structure of claim 1 wherein said continuous metal oxide surface comprises Ti.

* * * * *